United States Patent
Barsun

(10) Patent No.: US 6,728,101 B2
(45) Date of Patent: Apr. 27, 2004

(54) CARD SUPPORT ASSEMBLY

(75) Inventor: Stephan K. Barsun, Auburn, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/230,754

(22) Filed: Aug. 29, 2002

(65) Prior Publication Data

US 2004/0042170 A1 Mar. 4, 2004

(51) Int. Cl.[7] .................................................. G06F 1/16
(52) U.S. Cl. ........................................ 361/687; 361/683
(58) Field of Search ................................ 361/688–695, 361/720–722, 736, 737, 748, 752, 756, 759, 796–803

(56) References Cited

U.S. PATENT DOCUMENTS

| | | | |
|---|---|---|---|
| 5,508,883 A | 4/1996 | Lumbra et al. | |
| 5,923,531 A | * 7/1999 | Bachman et al. | ........... 361/690 |
| 6,141,213 A | 10/2000 | Antonuccio et al. | |
| 6,212,069 B1 | 4/2001 | Janik et al. | |
| 6,430,052 B1 | 8/2002 | Kordes et al. | |
| 6,437,979 B1 | 8/2002 | Unrein | |

\* cited by examiner

Primary Examiner—Darren Schuberg
Assistant Examiner—Yean-Hsi Chang

(57) ABSTRACT

A card support assembly includes at least one support member, a plurality of printed heat generating circuit cards and at least one flow control member. The circuit cards are coupled to the support member and extend non-parallel from the support member. The plurality of cards, collectively, have a front edge longitudinally spaced from a rear edge. The at least one flow control member faces the at least one support member with the cards therebetween. The at least one flow control member is substantially imperforate from the front edge to the rear edge.

20 Claims, 6 Drawing Sheets

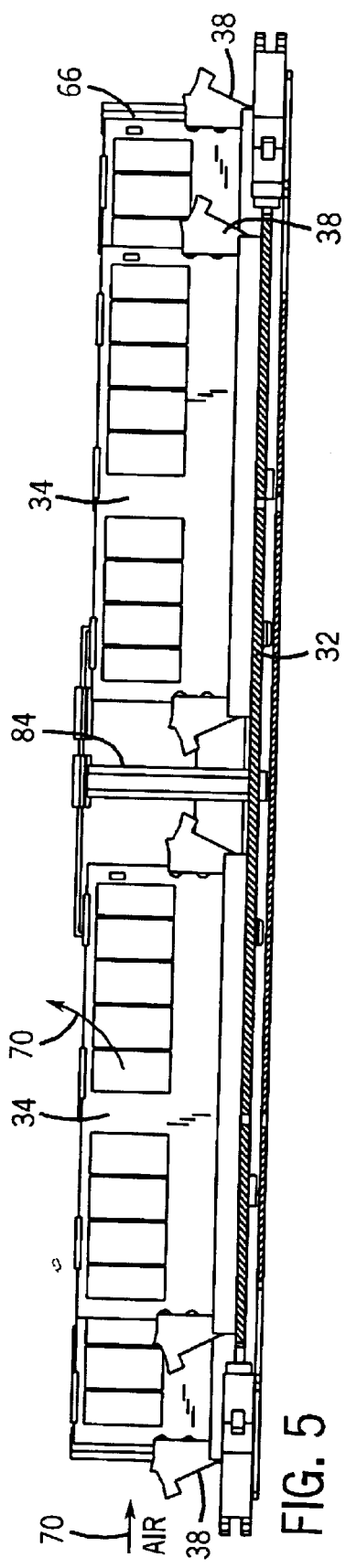
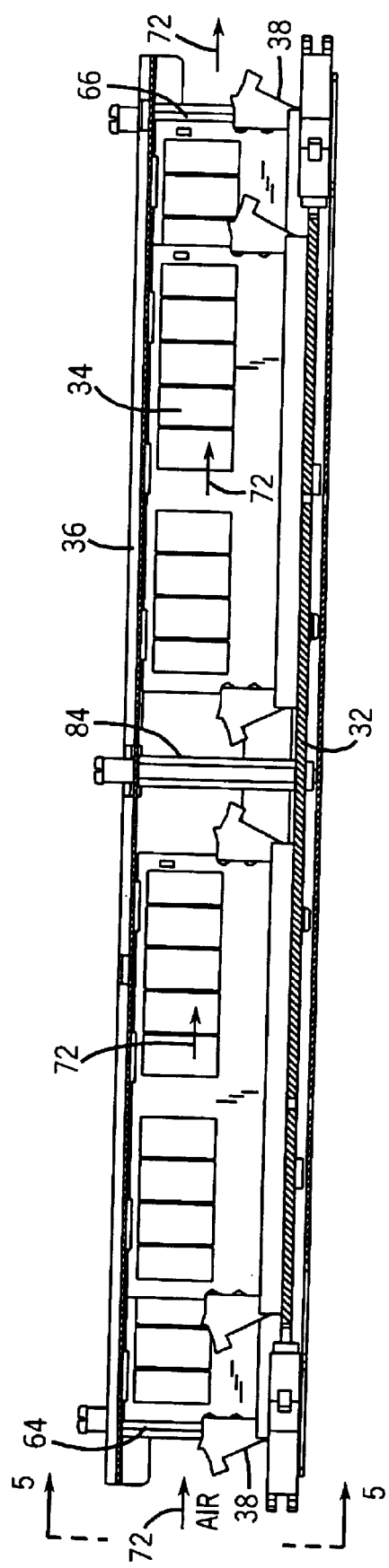
FIG. 5
FIG. 6

CARD SUPPORT ASSEMBLY

BACKGROUND OF THE INVENTION

Computing devices, such as servers, typically include a plurality of circuit cards, such as memory cards, mounted to a motherboard or printed circuit board. Such circuit cards are frequently braced against vibration by one or more individual rigid structures which bear against the edges of the cards opposite the printed circuit board. Such bracing structures are further provided with foam or fingers to support the cards. When in use, the circuit cards generate extreme heat. As a result, computing devices typically include one or more fans for directing air between the circuit cards to cool the cards. Unfortunately, much of the air flow across the cards frequently escapes, resulting in excessive heat build up and potential damage to the circuit cards.

SUMMARY OF THE INVENTION

A card support assembly includes at least one support member, a plurality of printed circuit cards that generate heat and at least one flow control member. The circuit cards are coupled to the support member and extend non-parallel from the support member. The plurality of cards, collectively, have a front edge longitudinally spaced from a rear edge. The at least one flow control member faces the at least one support member with the cards therebetween.

The at least one flow control member is substantially imperforate from the front edge to the rear edge.

According to another aspect of the present invention, a card support assembly includes at least one support member, a plurality of printed circuit cards that generate heat, at least one flow control member, a shock absorber and a spacer. The plurality of circuit cards are removably coupled to the support member and extend non-parallel from the support member. The plurality of cards, collectively, have a front edge longitudinally spaced from a rear edge. Each card has a front edge longitudinally spaced from a rear edge. The plurality of cards includes a first card and a second card. The first card has a first face, a first edge proximate the at least one support member and a second opposite edge. The second card has a second face facing the first face, a third edge proximate the at least one support member and a fourth opposite edge. The at least one flow control member faces the at least one support member with the cards therebetween. The at least one flow control member is substantially imperforate from the front edge to the rear edge. The shock absorber is coupled to the at least one flow control member and extends into engagement with at least a portion of the second edge of the first card. The spacer is coupled to the at least one flow control member and extends between the first face and the second face.

According to another aspect of the present invention, a method for assembling a computing device is disclosed. The method includes mounting a plurality of printed circuit cards that generate heat to a support member, wherein the plurality of cards, collectively, have a first end edge longitudinally spaced from a second end edge. The method further includes the step of mounting at least one flow control member proximate to the plurality of circuit cards such that the flow control member extends perpendicular to the plurality of cards. The at least one flow control member is substantially imperforate from the first end edge to the second end edge.

BRIEF DESCRIPTION OF THE DRAWINGS

FIG. 5 is a bottom plan view of the card support shown in FIG. 2 omitting a flow control member.

FIG. 6 is a bottom plan view of the card support shown in FIG. 2.

DETAILED DESCRIPTION OF THE PREFERRED EMBODIMENTS

Figure 1:
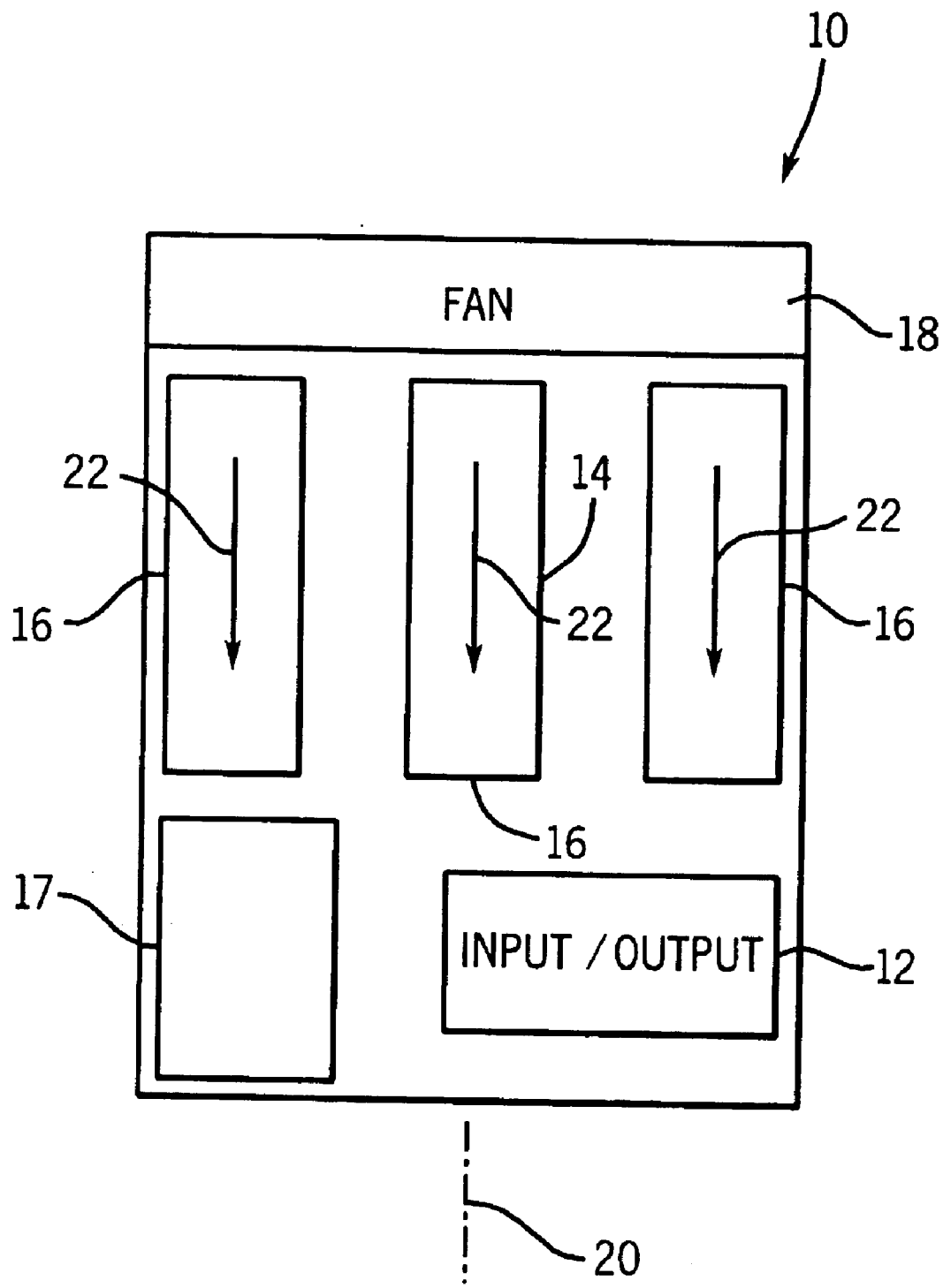
FIG. 1 is a drawing schematically illustrating a computing device incorporating a card support of the present invention.

FIG. 1 schematically illustrates a basic computing device 10 incorporating features of the present invention. Computing device 10 generally includes input/output 12, processor 14, memory units 16, power supply 17 and fan unit 18. In the embodiment shown in which computing device 10 comprises a server, input/output 12, processor 14, and memory unit 16 are each electrically connected to a baseboard (not shown) which is a circuit board that acts as an interface between each of the elements. Input/output 12 generally comprises an input/output board supporting a plurality of input/output cards. Input/output 12 facilitates the use of additional peripherals such as tape drives, DVDs, and the like, with computing device 10.

Processor 14 does the computing, calculations, or information retrieval for computing device 10, and generally includes a circuit board, a plurality of processor units and a control. An example of one particular processor is shown and described in co-pending U.S. patent application Ser. Nos. 10/230,807 and 10/230,771 filed on the same date herewith by Stephan K. Barsun, Steven R. Hahn, and Thomas J. Augustine, and entitled "Circuit Board Support Assembly," the full disclosures of which are hereby incorporated by reference.

Memory units 16 are coupled to the baseboard and provide memory storage for computing device 10. Like input/output 12, each memory unit 16 generally includes a circuit board supporting a plurality of individual cards. Such cards in memory unit 16, as well as input/output 12, are generally positioned upon the supporting circuit board so as to extend substantially parallel to or coincident with axis 20. The supporting circuit boards in input/output 12 and memory unit 16 are also preferably oriented so as to extend parallel to or coincident with axis 20.

Fan unit 18 is generally supported by the overall frame or housing of computing device 10 and is configured to circulate a cooling gas such as air through and across one or more of input/output 12, processor 14, and memory unit 16. Fan unit 18 generally circulates the cooling gas through computing device 10 in a direction substantially parallel to axis 20. As indicated by arrows 22, the air flow passes through memory unit 16 to expel or dissipate heat generated by the cards of the memory unit 16. Such air flow also desirably passes through input/output 12 to expel or dissipate heat generated by the cards of input/output 12. As described in greater detail in FIGS. 2–7, each memory unit 16 includes a card support assembly 30 (shown in FIG. 2) having a flow control member 36 to maximize air flow from fan unit 18 across the cards to more effectively expel heat generated by the cards.

Figure 2:
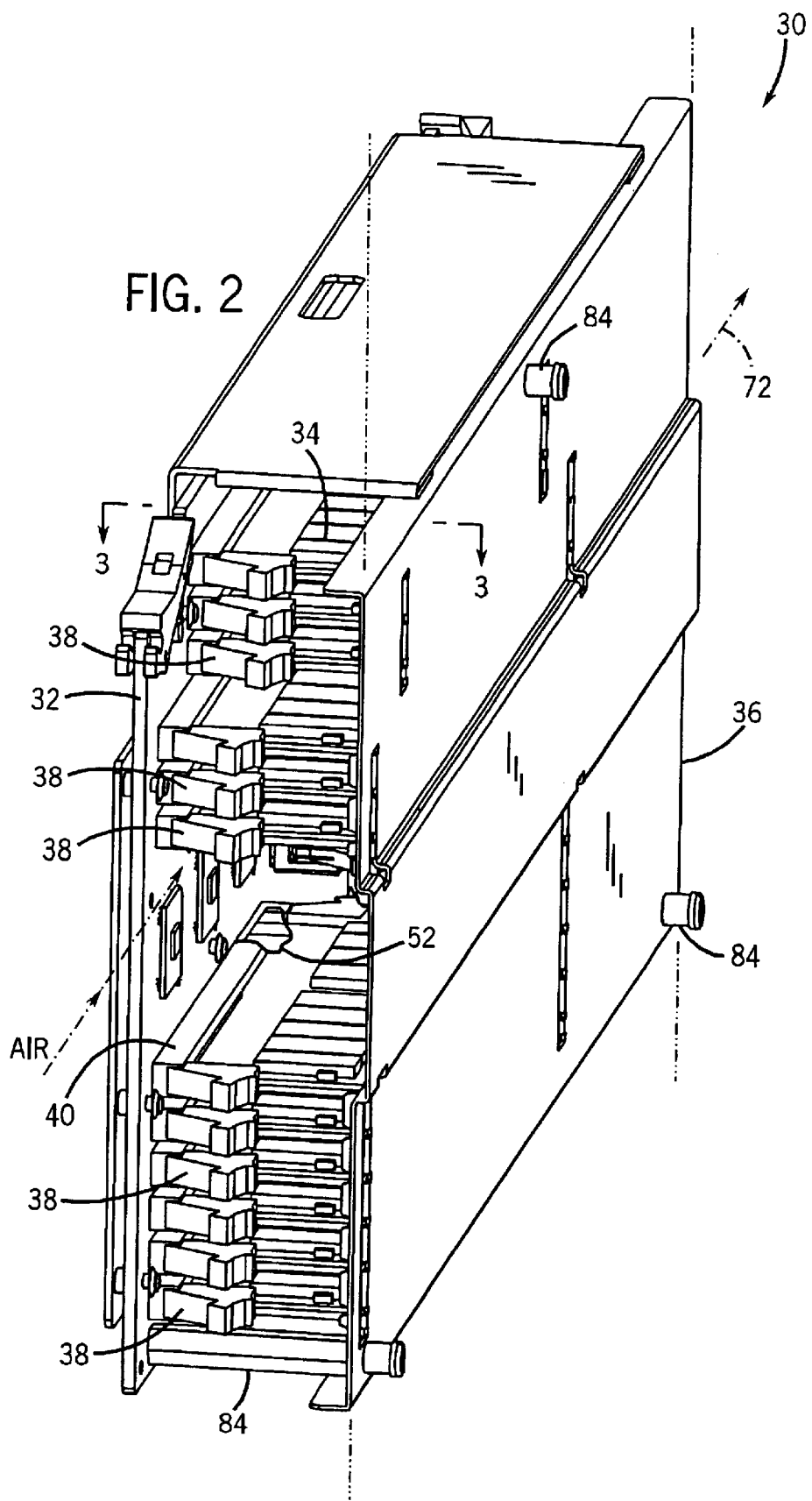
FIG. 2 is a perspective view of the card support.
Figure 3:
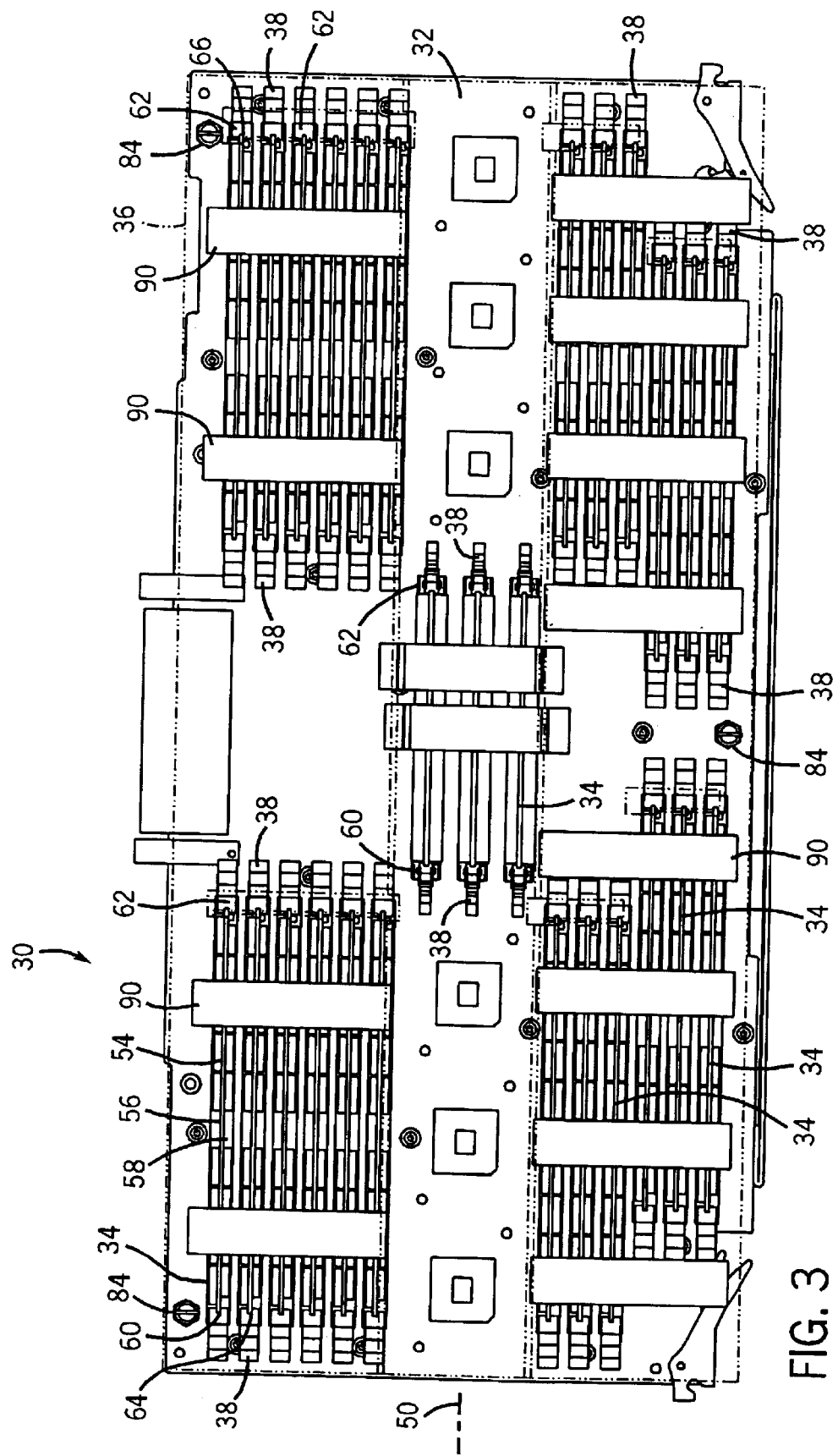
FIG. 3 is a right side elevational view of the card support shown in FIG. 2 with portions shown in phantom for purposes of illustration.
Figure 4:
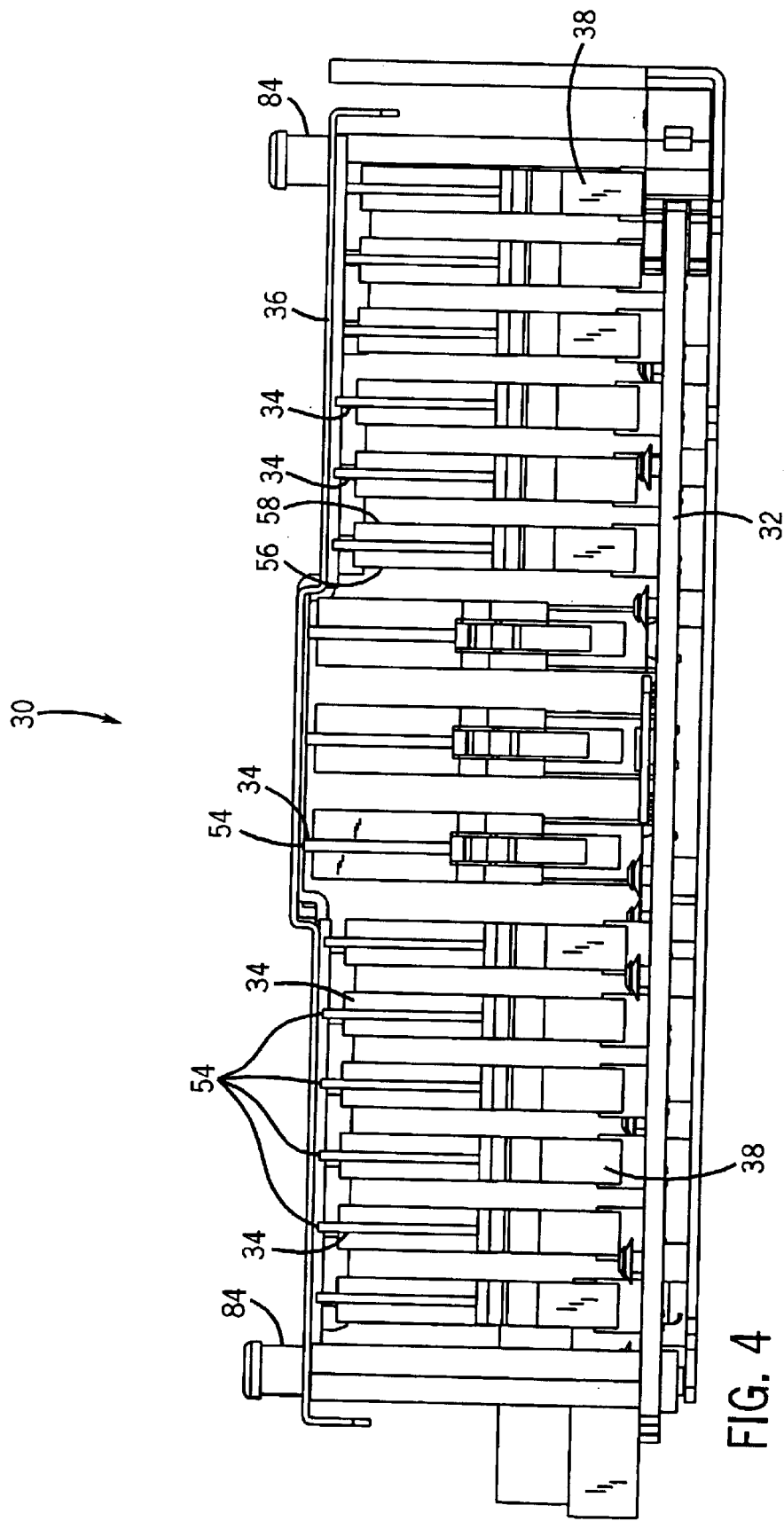
FIG. 4 is a front elevational view of the card support shown in FIG. 2.

FIGS. 2–4 illustrate card support assembly 30 in greater detail. Card support assembly 30 generally includes support member 32, circuit cards 34, and flow control member 36. Support member 32 supports each of circuit cards 32. In the particular embodiment illustrated, support member 32 comprises a circuit board (also known as a printed circuit assembly) to which cards 34 are coupled. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. Although support member 32 is illustrated as including card retainers 38 which retain cards 34 within appropriate pin and socket slots 40, support member 32 may alternatively include other conventionally known or future developed mechanisms for retaining cards 34 relative to one another and for electrically connecting cards 34 to the circuit board constituting support member 32.

Circuit cards 34 are coupled to support member 32 and extend nonparallel from support member 32. As best shown by FIG. 3, circuit cards 34 are arranged in substantially parallel fashion along longitudinal axis 50 in an end-to-end relationship. Circuit cards 34 are further arranged in a plurality of rows transversely spaced from one another. Each circuit card 34 has a mounting edge 52 carrying electrical connection points (shown in the broken away portion in FIG. 2) and an opposite edge 54 proximate to flow control member 36. Each card 34 further includes opposite faces 56, 58 and end edges 60, 62. Although each circuit card 34 is illustrated as being substantially rectangular in shape, circuit cards 34 may alternatively have alternative shapes.

In the particular embodiment illustrated, cards 34 comprise memory cards configured to store data and other information. Although card support assembly 30 is illustrated as including such memory cards 34, card support assembly 30 may alternatively be used to support alternative circuit cards such as input/output cards and the like. The exact configuration and number of such cards may be varied depending on the particular application and the particular type of computing device in which card support assembly 30 is employed.

As best shown by FIG. 3, circuit cards 34, collectively, have a front edge 64 and a rear edge 66. As card support assembly 30 is depicted in FIG. 3, front edge 64 constitutes the leftward most edge of any of cards 34 while rear edge 66 comprises the rightward most edge of any of cards 34. As a result, it is important that cooling air or other gas from fan unit 18 be circulated along faces 56, 58 of cards 34 substantially and entirely between ends 64 and 66.

FIGS. 2 and 4 best illustrate flow control member 36 coupled to support member 32. Flow control member 36 faces support member 32 and extends above edges 58 of cards 34. In the particular embodiment illustrated, flow control member 36 has a lower surface opposite and very near to the edge 54. The lower surface of member 36 opposite edge 54 is spaced less than 10 millimeters from edge 54 to insure adequate control of air flow past cards 34. In the particular embodiment illustrated, this lower surface is spaced from edge 54 by approximately 1 millimeter to maximize air flow control. As a result, air flow around edge 54 is minimized. Flow control member 36 is substantially imperforate from front edge 64 to rear edge 66 of adjacent cards 34. As a result, flow control member 36 effectively cooperates with support member 32 and cards 34 to form ducting directing air flow to more effectively cool cards 34.

FIGS. 5 and 6 best illustrate the function served by flow control member 36. FIG. 5 illustrates support member 32 and cards 34 without air flow control member 36. In this undesirable configuration, air flow, indicated by arrows 70, naturally chooses the path of least resistance. As a result, the air flow 70 naturally diverts around upper edges 54. Consequently, cards 34 located proximate to rear edge 66 receive reduced air circulation, leading to greater heat buildup. This heat buildup increases the risk of cards 34 being damaged as a result of not being properly cooled.

FIG. 6 illustrates support 32 and cards 34 additionally provided with flow control member 36. As indicated by arrows 72, because flow control member 36 is substantially imperforate and extends proximate to upper edge 54 of cards 34, air flow or air circulation is maintained adjacent to and between faces 56 and 58 of cards 34 from front edge 64 to rear edge 66. As a result, all of cards 34 and card support assembly 30 are properly cooled by air circulating through support assembly 30.

Figure 7:
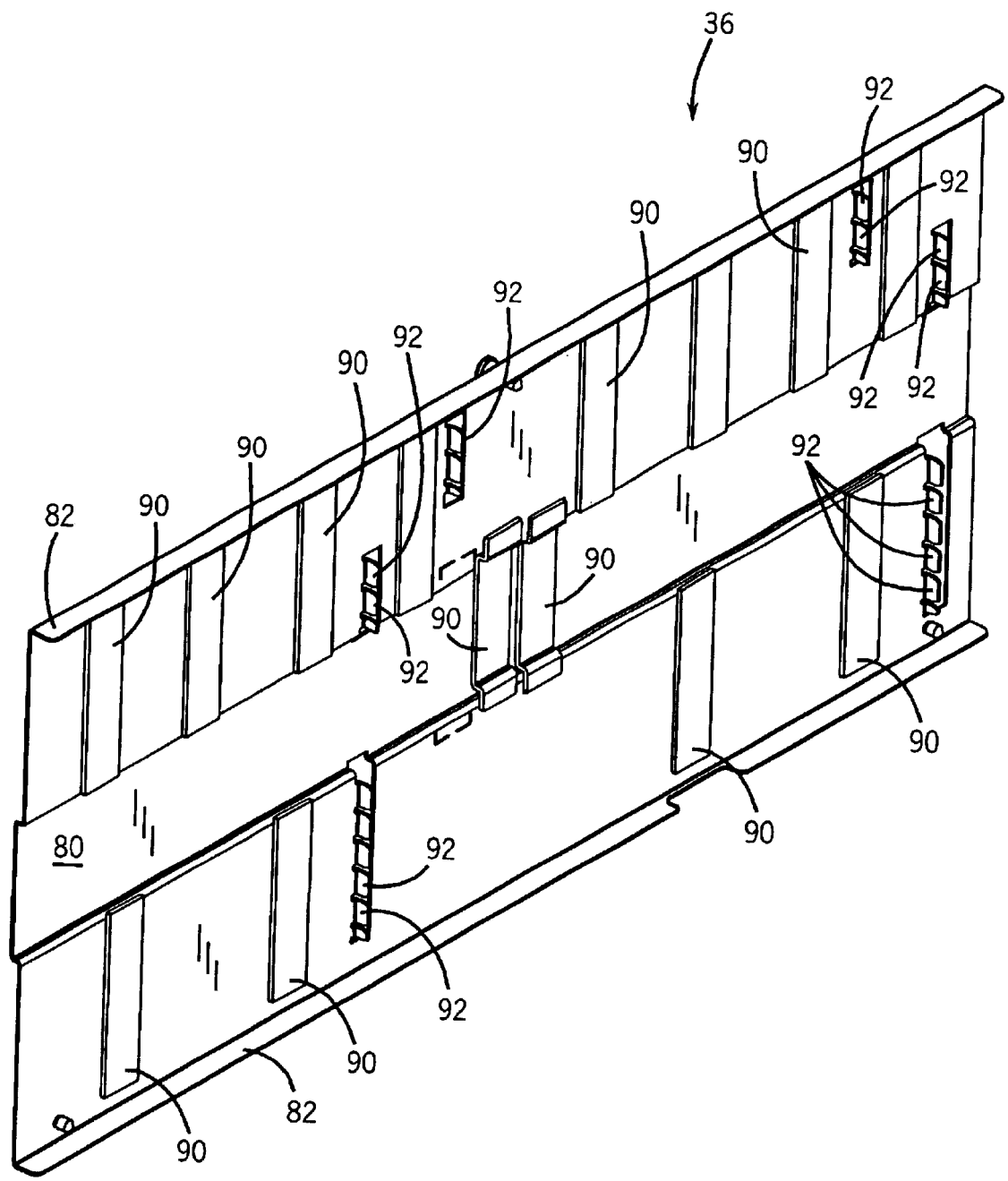
FIG. 7 is a top perspective view of a flow control member of the card support of FIG. 2.

FIG. 7 illustrates flow control member 36 in greater detail. As shown by FIG. 7, flow control member 36 generally comprises an elongate planar member formed as sheet metal having a substantially uniform thickness throughout. Flow control member 30 includes a central channel 80 and opposing in-turned edges 82. Channel 80 and edges 82 strengthen and rigidify flow control member 36. As shown by FIGS. 2, 4, and 6, flow control member 36 is supported relative to support member 32 and cards 34 by posts 84 extending from support member 32. Alternatively, flow control member 36 itself may include downwardly extending posts or legs which extend into engagement with support 32. In yet alternative embodiments, flow control member 36 may be supported relative to support member 32 and cards 34 by alternative structures, such as an adjacent housing or surrounding enclosure of computing device 10.

Although flow control member 36 is illustrated as being formed from sheet metal, flow control member 36 may alternatively be formed from cast metal, machined metal, or a molded polymer. Although flow control member 36 is illustrated as a single continuous member, member may alternatively be formed by a plurality of structures mounted to one another or mounted in close proximity with one another. Furthermore, flow control member 36 may alternatively be provided with a non-uniform thickness in either or both the longitudinal and transverse directions. For example, in particular applications wherein cards extend away from support member 32 by different distances, flow control member 36 may be appropriately deformed or have a varying thickness so as to form a step or slope such that flow control member 36 still extends into close proximity with edge 54 of each card 34. Although less desirable, individual cards 34 having different heights between edges 52 and 54 may alternatively be spaced by different distances from the lower surface of flow control member 36.

FIG. 7 further illustrates additional elements coupled to flow control member 36 as part of card support assembly 30. In particular, card support assembly 30 additionally includes shock absorbers 90 and spacers 92. Shock absorbers 90 are coupled to flow control member 36 and extend into engagement with at least a portion of edge 54. Shock absorbers 90 each include a surface in engagement with edge 54 that is resilient in a direction perpendicular to edge 54. In the particular embodiment illustrated, shock absorbers 90 comprise strips of resilient foam coupled to member 36. Alternatively, shock absorbers 90 may be provided by a variety of other materials that are resilient or by mechanisms which are resilient. Shock absorbers 90 provide additional support to cards 34 to protect cards 34 against shock and vibration.

Spacers 92 are coupled to support member 36 and are configured so as to extend between faces 56 and 58 of transversely adjacent cards 34. Spacers 92 are configured to substantially abut portions of faces 56 and 58 to prevent cards 34 from transversely swaying or bending. As a result, spacers 92 further protect and support cards 34.

In the embodiment illustrated, spacers 92 are integrally formed as a single unitary body with flow control member 36. In particular, spacers 92 are formed by cutting and deforming small portions of sheet metal forming member 36. In alternative embodiments, spacers 92 may be integrally formed as part of member 36 with other means such as by casting, machining or molding. In yet other alternative embodiments, spacers 92 may be permanently or removably attached to member 36. Although less desirable, card support assembly 30 may alternatively omit either or both of shock absorbers 90 and spacers 92.

Although the present invention has been described with, reference to preferred embodiments, workers skilled in the art will recognize that changes may be made in form and detail without departing from the spirit and scope of the invention. For example, although different preferred embodiments may have been described as including one or more features providing one or more benefits, it is contemplated that the described features may be interchanged with one another or alternatively be combined with one another in the described preferred embodiments or in other alternative embodiments. Because the technology of the present invention is relatively complex, not all changes in the technology are foreseeable. The present invention described with reference to the preferred embodiments and set forth in the following claims is manifestly inteded to be broad as possible. For example, unless specifically otherwise noted the claims reciting a single particular element also encompass a plurality of such particular elements.

What is claimed is:

1. A card support assembly comprising:
   at least one support member;
   a plurality of printed heat generating circuit cards coupled to the support member and extending non-parallel from the support member, the plurality of cards, collectively, having a front edge longitudinally spaced from a rear edge; and
   at least one flow control member facing the at least one support member with the cards between the at least one support member and the at least one flow control member, wherein the at least one flow control member is substantially imperforate from the front edge to the rear edge, wherein the plurality of cards includes a first card having a first face and a second card having a second face facing the first face, the assembly further including a spacer coupled to the at least one flow control member, the spacer extending between the first face and the second face.

2. The assembly of claim 1, wherein the flow control member is coupled to the at least one support member.

3. The assembly of claim 1, wherein the cards comprise memory cards.

4. The assembly of claim 1, wherein the at least one flow control member comprises a single continuous flow control member.

5. The assembly of claim 4, wherein the flow control member is integrally formed as a single unitary body.

6. The assembly of claim 1, wherein the plurality of cards includes a first card providing the front edge and a second card providing the rear edge.

7. The assembly of claim 1, wherein the plurality of cards includes a plurality of transversely spaced cards.

8. The assembly of claim 1, wherein the at least one flow control member is substantially imperforate in a transverse direction.

9. The assembly of claim 1, wherein the at least one flow control member has a substantially uniform thickness.

10. The assembly of claim 1, wherein the at least one flow control member includes deformed sheet metal.

11. The assembly of claim 1, wherein the plurality of cards includes a card having a first edge proximate the at least one support member and a second opposite edge, and wherein the assembly further includes a shock absorber coupled to the at least one flow control member and extending into engagement with at least a portion of the second edge.

12. The assembly of claim 11, wherein the shock absorber includes a surface in engagement with at least a portion of the second edge, wherein the surface is resilient in a direction perpendicular to the edge.

13. The assembly of claim 1, wherein the spacer is integrally formed as a single unitary body with the at least one flow control member.

14. The assembly of claim 1, including a gas flow source proximate the front edge, wherein the at least one flow control member extends at least substantially proximate to the gas flow source.

15. The assembly of claim 1, wherein the plurality of cards includes a first card having a first edge proximate the at least one support member and a second opposite edge, and wherein the at least one flow control member has a lower surface opposite the second edge and spaced less than 10 millimeters from the second edge.

16. The assembly of claim 1, wherein the at least one support member includes at least one printed circuit board.

17. The assembly of claim 1, wherein the plurality of printed circuit cards that generate heat are removably coupled to the support member.

18. A card support assembly comprising:

at least one support member;

a plurality of printed heat generating circuit cards removably coupled to the support member and extending non-parallel from the support member, the plurality of cards, collectively, having a front edge longitudinally spaced from a rear edge, the plurality of cards including a first card having a first face, a first edge proximate the at least one support member and a second opposite edge, and a second card having a second face facing the first face, a third edge proximate the at least one support member and a fourth opposite edge;

at least one flow control member facing the at least one support member with the cards between the at least one support member and the at least one flow control member, wherein at least one flow control member is substantially imperforate from the front edge to the rear edge;

a shock absorber coupled to the at least one flow control member and extending into engagement with at least a portion of the second edge of the first card; and a spacer coupled to the at least one flow control member and extending between the first face and the second face.

19. The assembly of claim 18, wherein the at least one flow control member comprises a single continuous flow control member.

20. The assembly of claim 18, wherein the at least one support member includes at least one printed circuit board.

* * * * *